(12) United States Patent
Ida et al.

(10) Patent No.: US 8,198,204 B2
(45) Date of Patent: Jun. 12, 2012

(54) ALUMINA CERAMIC

(75) Inventors: Makoto Ida, Tokyo (JP); Fumio Ishida, Tokyo (JP); Yoshiaki Teraishi, Tokyo (JP); Takuya Yamashita, Toyama (JP)

(73) Assignee: Nippon Carbide Kogyo Kabushiki Kaisha, Tokyo (JP)

( * ) Notice: Subject to any disclaimer, the term of this patent is extended or adjusted under 35 U.S.C. 154(b) by 82 days.

(21) Appl. No.: 12/992,386

(22) PCT Filed: Jun. 22, 2009

(86) PCT No.: PCT/JP2009/061334
§ 371 (c)(1),
(2), (4) Date: Nov. 12, 2010

(87) PCT Pub. No.: WO2010/001760
PCT Pub. Date: Jan. 7, 2010

(65) Prior Publication Data
US 2011/0065565 A1    Mar. 17, 2011

(30) Foreign Application Priority Data

Jun. 30, 2008 (JP) ................................. 2008-171430

(51) Int. Cl.
C04B 35/195 (2006.01)
(52) U.S. Cl. ........................................ 501/125; 501/128
(58) Field of Classification Search .................. 501/125, 501/128
See application file for complete search history.

(56) References Cited

U.S. PATENT DOCUMENTS

2008/0269040 A1    10/2008  Sugawara
2010/0311563 A1*   12/2010  Furuse et al. ................. 501/125

FOREIGN PATENT DOCUMENTS

| JP | 09-227221 | 9/1997 |
| JP | 2004-228531 | 8/2004 |
| JP | 2007-084353 | 4/2007 |
| JP | 2007-284333 | 11/2007 |
| WO | WO2007/034955 | 3/2007 |

OTHER PUBLICATIONS

International Search Report PCT/JP2009/061334, Jul. 21, 2009.

* cited by examiner

Primary Examiner — Karl Group
(74) Attorney, Agent, or Firm — Young & Thompson

(57) ABSTRACT

An alumina ceramic contains a $Ba_{0.808}Al_{1.71}Si_{2.29}O_8$ phase. The alumina ceramic has high reflectivity and is useful as a reflecting material for a light emitting element. The alumina ceramic which exhibits an X-ray diffraction pattern having a ratio of the peak intensity at $2\theta=43.3°$ to that at $22.5°$ of 0.5 to 2.5 has particularly high reflectivity. The alumina ceramic shows high reflectivity particularly at wavelengths ranging from 300 to 400 nm.

8 Claims, 3 Drawing Sheets

[Fig.1]
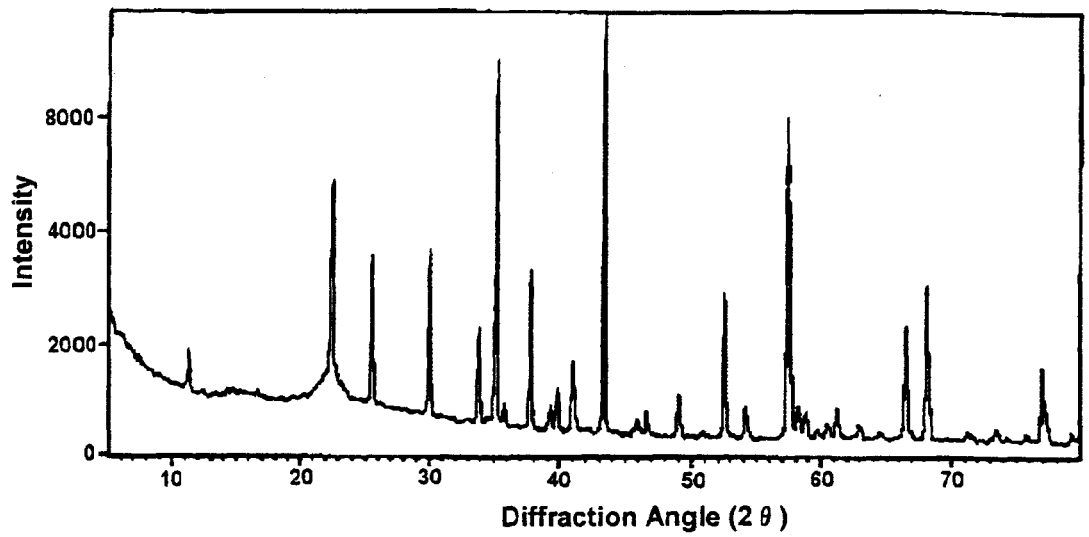
[Fig.2]
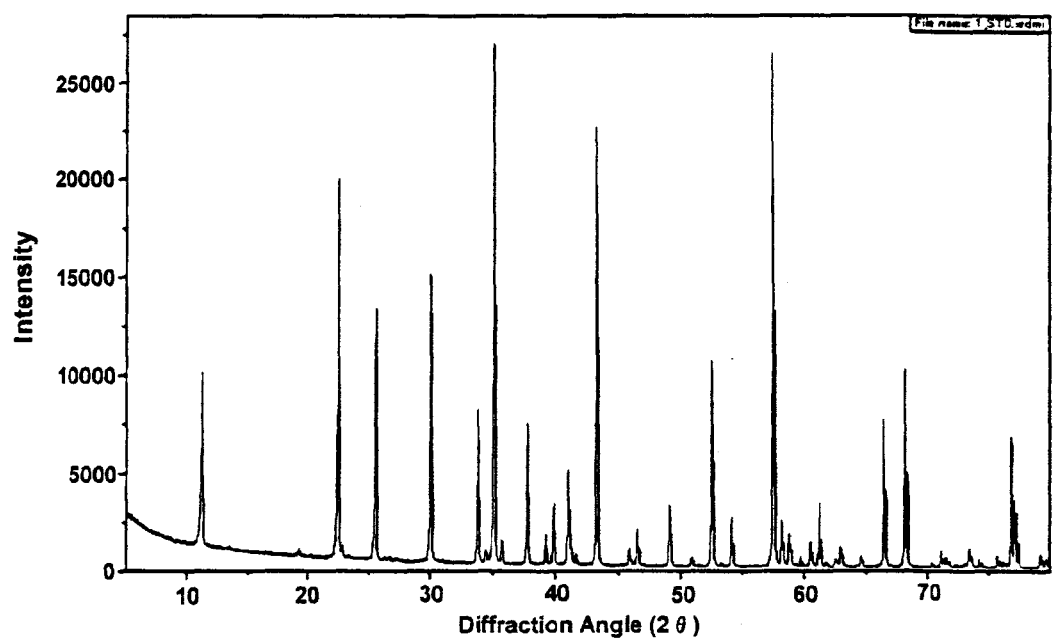

[Fig.3]
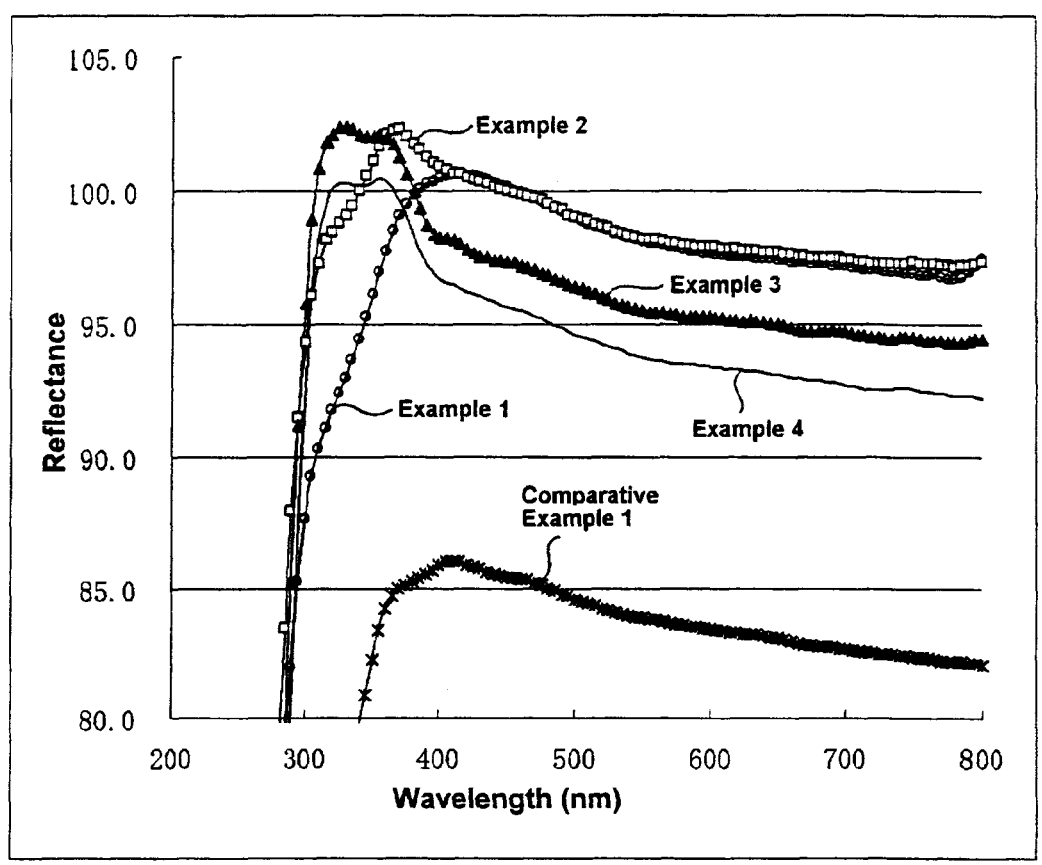

[Fig.4]
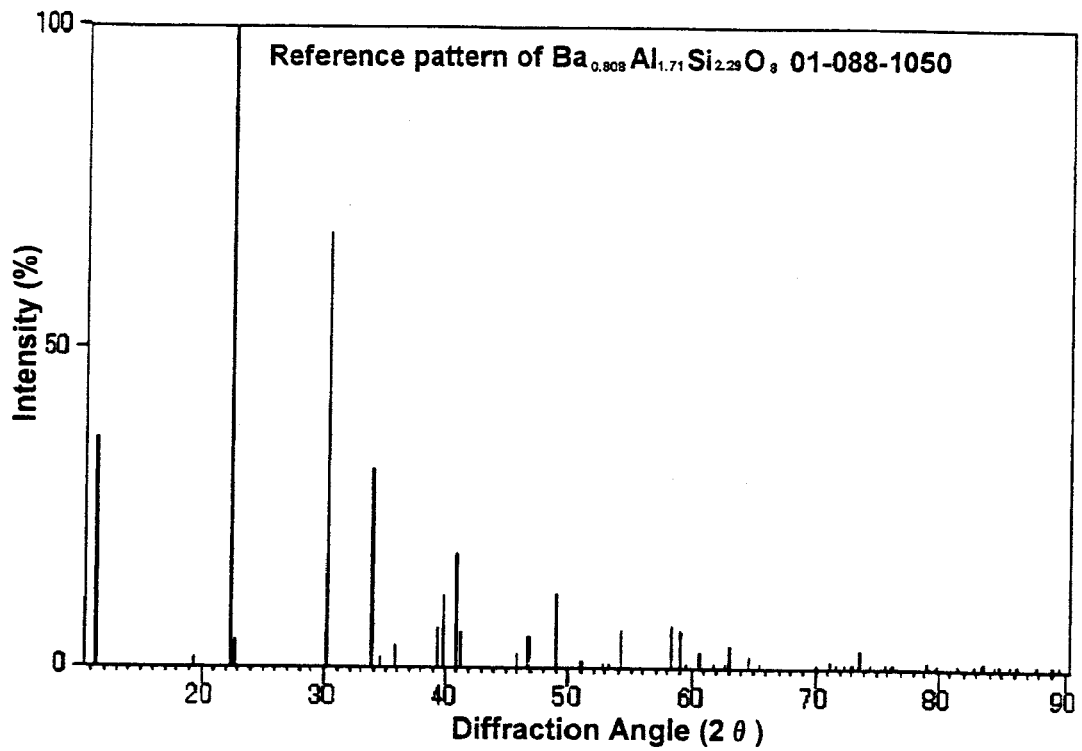
[Fig.5]
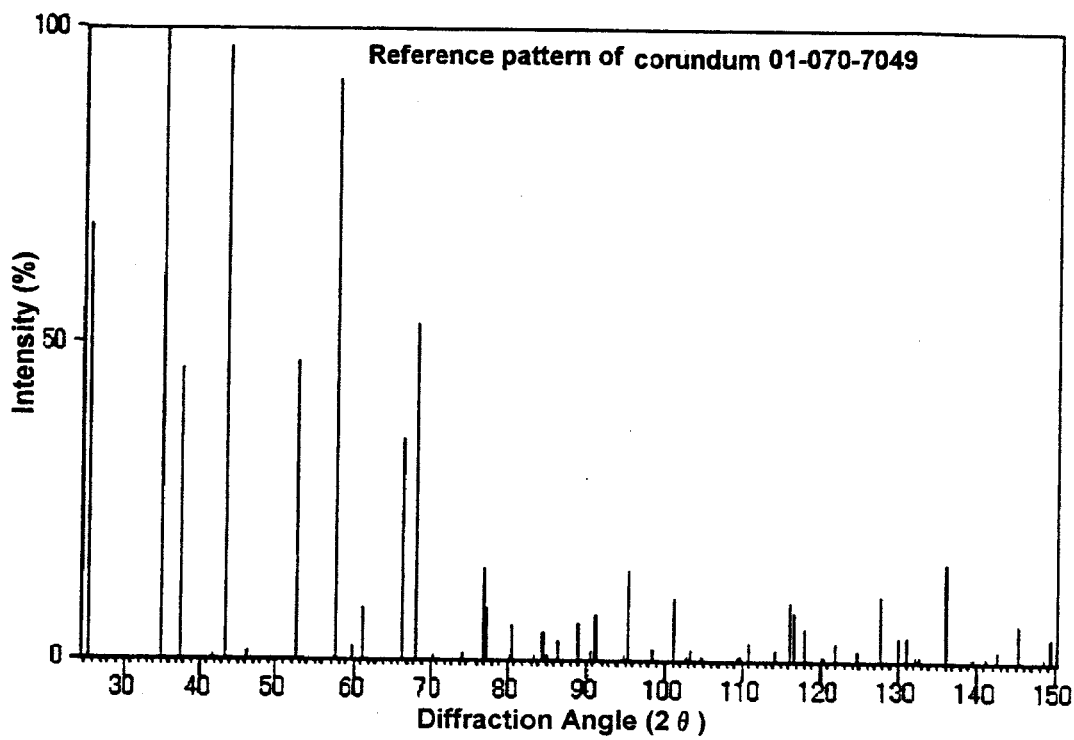

ALUMINA CERAMIC

TECHNICAL FIELD

This invention relates to alumina ceramics with high light reflectivity.

BACKGROUND ART

Ceramic packages have been used to contain a light-emitting element, such as a high brightness light-emitting diode (LED) and a semiconductor laser diode (LD).

A conventional ceramic package includes a substrate on which a light emitting element is to be mounted and a frame defining an opening provided on the substrate. The substrate has wiring conductors electrically connected to an external power source. A light emitting element is electrically connected to the wiring conductors by wire bonding. Electricity is externally supplied to the light emitting element via the bonding wires to cause the device to emit light. The emitted light is released outside through the opening directly and after reflected on the surface of the substrate or inner circumferential surface of the frame. Therefore, the shape and composition of the substrate surface and the inner circumferential surface of the frame are greatly influential on the light emission efficiency of a light emitting device.

It is known to use high reflection metal to make the frame of the above described light emitting device. In this case, because the ceramic substrate and the metallic frame have different thermal expansion coefficients, the frame can separate from the substrate due to the heat generated from the light emitting element. To prevent the separation, a ceramic frame plated with metal is proposed (e.g., Patent Document 1). Silver (Ag) is known as a high reflection plating material. In using Ag, about 90% reflectance, relative to barium sulfate, of wavelengths of about 460 nm is achieved. However, the reflectances of wavelengths shorter than about 460 nm are low, averaging 77% in a wavelength range of from 250 nm to 800 nm.

Patent Document 1: JP 2004-228531A

SUMMARY OF THE INVENTION

Problem To Be Solved By The Invention

As described, conventional ceramic packages achieve only insufficient reflectivity even when plated with metal.

The present invention has been accomplished in the light of the above circumference. An object of the invention is to provide an alumina ceramic that achieves high light reflection without being plated with metal, particularly at wavelengths of 300 to 400 nm. Another object is to provide a reflective material with high reflectivity for a light emitting element.

Means for Solving the Problem

As a result of extensive investigations, the present inventors have found that an alumina ceramic containing a $Ba_{0.808}Al_{1.71}Si_{2.29}O_8$ phase exhibits excellent light reflectivity. They have found that particularly high reflectivity is achieved when the $Ba_{0.808}Al_{1.71}Si_{2.29}O_8$ phase content in the alumina ceramic is such that the X-ray diffraction pattern of the alumina ceramic has a ratio of the peak intensity at diffraction angle (2θ) of 43.3° to that at 2θ of 22.5° of 0.5 to 2.5. In other words, an alumina ceramic the X-ray diffraction pattern of which has a ratio of the peak intensity at diffraction angle (2θ) of 43.3°, which is assigned to a corundum ($Al_2O_3$) phase, to that at 22.5°, which is assigned to the $Ba_{0.808}Al_{1.71}Si_{2.29}O_8$ phase, of 0.5 to 2.5 has been found particularly excellent in reflectivity.

The inventors have also found that an alumina ceramic containing a $Ba_{0.808}Al_{1.71}Si_{2.29}O_8$ phase and having a Ba to Si molar ratio, Ba/Si, of 8/1 to 8/12 exhibits excellent reflectivity at wavelengths of 300 to 400 nm.

Effect of the Invention

The alumina ceramic containing a $Ba_{0.808}Al_{1.71}Si_{2.29}O_8$ phase according to the invention has high light reflectivity. The alumina ceramic containing a $Ba_{0.808}Al_{1.71}Si_{2.29}O_8$ phase such that the X-ray diffraction pattern may have a ratio of the peak intensity at diffraction angle (2θ) of 43.3° to that at 2θ of 22.5° of 0.5 to 2.5 exhibits particularly high reflectivity. The alumina ceramic of the invention has high reflectivity particularly at wavelengths of 300 to 400 nm.

BRIEF DESCRIPTION OF THE DRAWING

FIG. 1 is an X-ray diffraction pattern of the alumina ceramic of Example 1 according to the invention.

FIG. 2 is an X-ray diffraction pattern of the alumina ceramic of Example 2 according to the invention.

FIG. 3 is a graph of reflectance vs. wavelength for the alumina ceramic articles of Examples 1 to 4 according to the invention and a conventional alumina substrate of Comparative Example 1.

FIG. 4 is an X-ray diffraction pattern of a $Ba_{0.808}Al_{1.71}Si_{2.29}O_8$ phase found in ICDD card No. 01-088-1050.

FIG. 5 is an X-ray diffraction pattern of a corundum ($Al_2O_3$) phase found in ICDD card No. 01-070-7049.

BEST MODE FOR CARRYING OUT THE INVENTION

The alumina ceramic containing a $Ba_{0.808}Al_{1.71}Si_{2.29}O_8$ phase is obtained by firing a raw material containing alumina ($Al_2O_3$), silica ($SiO_2$), and a barium compound.

It is preferred to use alumina with an average particle size of 5 μm or less. Alumina with an average particle size of 0.1 to 3 μm is particularly preferred in terms of reflectivity and flexibility of the resulting alumina ceramic and sinterability of the raw material.

If desired, two or more kinds of alumina having different average particle sizes may be used in combination to adjust the reflectivity, flexibility, and sinterability. Examples of suitable combinations of two average particle sizes of alumina include, but are not limited to, (3 μm+0.2 μm), (3 μm+0.3 μm), (3 μm+0.4 μm), (3 μm+0.5 μm), (3 μm+0.6 μm), (2 μm+0.2 μm), (2 μm+0.3 μm), (2 μm+0.4 μm), (2 μm+0.5 μm), and (2 μm+0.6 μm). Three or more different average particle sizes of alumina may be used in combination. In using two different particle sizes of alumina, a preferred weight ratio of larger size alumina to smaller size alumina is 100/1 to 60/40. To obtain ensured effects of using different average particle sizes of alumina, that weight ratio (larger size alumina/smaller size alumina) is preferably 85/15 to 65/35, more preferably 80/20 to 70/30.

The silica which can be used to prepare the alumina ceramic of the invention preferably has an average particle size of 1 μm or less. Silica with an average particle size of 0.1 to 0.7 μm, particularly an average particle size of 0.3 to 0.6 μm, is preferably used to lower the hygroscopicity of the resulting alumina ceramic.

Examples of the barium compound that can be used to prepare the alumina ceramic of the invention include, but are not limited to, barium hydride, barium fluoride, barium hydroxide, barium oxide, barium chloride, barium carbonate, barium sulfate, and barium nitrate. Preferred of them are barium oxide and barium carbonate, the barium carbonate being particularly preferred. The barium compound preferably has an average particle size of 1.0 to 2.0 µm.

The alumina ($Al_2O_3$), silica ($SiO_2$), and barium compound (in terms of BaO) are preferably used in a weight ratio of ($BaO+SiO_2$)/($Al_2O_3$) of 4/96 to 24/76.

A preferred weight ratio of the barium compound (in terms of BaO) to silica ($SiO_2$), $BaO/SiO_2$, is 8/1 to 8/12.

To obtain an alumina ceramic having high reflectance at wavelengths of 300 to 400 nm, it is preferred to use the barium compound and silica in such a ratio as to result in a Ba to Si molar ratio (Ba/Si) of 8/1 to 8/12, more preferably 8/3 to 8/12, in the resulting alumina ceramic after sintering.

The alumina ceramic of the invention may be prepared by any known method. For example, the alumina ceramic may be prepared by a green sheet method including mixing a raw material blend containing the alumina, silica, and barium compound with an appropriate binder, an appropriate solvent, and so on to make a slurry, casting the slurry into a green sheet by doctor blade process or calender roll process, and firing the green sheet in high temperature (e.g., 1400° to 1600° C.). The alumina ceramic may also be obtained by a mold pressing method including pressing a powdered raw material in a mold into a green body and firing the green body. A sintered body of plate shape is preferably made by the green sheet method.

The following is an illustrative example of the production of alumina ceramics containing a $Ba_{0.808}Al_{1.71}Si_{2.29}O_8$ phase according to the invention by the mold pressing method.

Each of alumina, silica, and a barium compound is ground to a prescribed size. The resulting powders are weighed out in a ratio within the range recited above. A binder resin, a lubricant, and a solvent are added to the mixed powder, followed by mixing to make a slurry. The grinding and mixing are carried out using, for example, a ball mill. The grinding step may be omitted arbitrarily.

Examples of useful binder resins include acrylic resins and polyvinyl alcohol (PVA) resins. The content of the binder resin in the slurry is preferably 0.5% to 5.0% by mass, more preferably 1.5% to 3.5% by mass, based on the total solids content. When the proportion of the binder resin in the solids content is too much, particles subsequently obtained by granulation tend to become hard and suffer from density variation. When the amount of the binder resin is too small, the resulting green body will have insufficient strength.

Examples of useful lubricants include a stearic acid emulsion. The amount of the lubricant to be used is preferably 0.05% to 0.5%, more preferably 0.1% to 0.3%, by mass based on the total solids content of the slurry.

The solvent to be used is exemplified by water. The amount of the solvent is preferably 20% to 80%, more preferably 40% to 60%, by mass.

The slurry is granulated by drying into raw material powder of a size suited for pressing into a green body using, for example, a spray drier. The size of the powder particles is preferably 25 to 200 µm, more preferably 30 to 150 µm. The powder as obtained is classified using, for example, a sieve. Too coarse particles result in poor packing in a mold. Too fine particles tend to enter the clearance of a mold to cause fin formation.

The resulting raw material powder is packed in a mold and pressed at ambient temperature. The pressure to be applied to the powder is preferably 0.5 to 2.0 $t/cm^2$, more preferably 0.7 to 1.5 $t/cm^2$.

The resulting green body is fired in a kiln. A preferred firing temperature ranges from 1400° to 1600° C. Firing conditions, such as rate of heating to firing temperature, firing time, and rate of cooling, are selected as appropriate for the making of an alumina ceramic containing a $Ba_{0.808}Al_{1.71}Si_{2.29}O_8$ phase. For instance, the firing is carried out by maintaining the green body at 600° C. for 8 hours, raising the temperature up to 1600° C. over 8 hours, maintaining the green body at that temperature for 2 hours, followed by cooling over 6 hours. Where needed, the fired product is subjected to abrasive machining, such as barrel finishing, to remove fins.

The alumina ceramic containing a $Ba_{0.808}Al_{1.71}Si_{2.29}O_8$ phase according to the invention is thus obtained.

The following is an illustrative example of the production of an alumina ceramic containing a $Ba_{0.808}Al_{1.71}Si_{2.29}O_8$ phase according to the invention by the green sheet method.

Each of alumina, silica, and a barium compound is ground to a prescribed size. The resulting powders are weighed out in a ratio within the range recited above. A solvent, a binder resin, a dispersant, a plasticizer, etc. are added to the mixed powder, followed by kneading to make a slurry. The grinding and kneading are carried out using, for example, a ball mill.

Examples of useful binder resins include acrylic resins and polyvinyl alcohol (PVA) resins. The content of the binder resin in the slurry is preferably 4.0% to 20% by mass, more preferably 6.0% to 8.0% by mass, based on the total solids content.

Various kinds of surfactants may be used as a dispersant. The amount of the dispersant to be used is preferably 0.1% to 1.0%, more preferably 0.3% to 0.5%, by mass based on the total solids content of the slurry.

Examples of useful plasticizers include dioctyl phthalate (DOP) and dibutyl phthalate (DBP). The amount of the plasticizer to be used is preferably 3.0% to 15%, more preferably 4.0% to 6.0%, by mass.

Examples of useful solvents are alcohols and toluene. The amount of the solvent used is such that the total solids content of the slurry may range from 70% to 80% by mass. The viscosity of the slurry is preferably 3000 to 30000 cps, more preferably 10000 to 20000 cps.

The resulting slurry is cast on a release film and dried to remove the solvent by evaporation. The drying temperature is preferably 80° to 130° C., more preferably 100° to 120° C. The drying speed is preferably 0.2 m/min to 2.0 m/min.

The release film is stripped off to provide a green sheet, which is stamped into a desired shape using a press die and fired in a kiln. The firing temperature is preferably 1400° to 1600° C. Firing conditions, such as rate of heating to firing temperature, firing time, and rate of cooling, are selected as appropriate for the making of an alumina ceramic containing a $Ba_{0.808}Al_{1.71}Si_{2.29}O_8$ phase. For instance, the firing is carried out by maintaining the green sheet at 600° C. for 8 hours, raising the temperature up to 1600° C. over 8 hours, maintaining the green sheet at that temperature for 2 hours, followed by cooling over 6 hours. Where needed, the fired product may be polished by, for example, sand blasting.

The alumina ceramic containing a $Ba_{0.808}Al_{1.71}Si_{2.29}O_8$ phase according to the invention is thus obtained.

The presence of the $Ba_{0.808}Al_{1.71}Si_{2.29}O_8$ phase in the alumina ceramic of the invention can be confirmed by X-ray diffractometry. The method of X-ray diffractometry is described below. The reflectivity of the alumina ceramic of the invention is evaluated by measuring reflectance in accordance with the method described below.

Method Of X-ray Diffractometry:

X-Ray diffractometry is carried out using an X-ray diffractometer X'pert PRO from Spectris Co., Ltd. in accordance with the procedure of asbestos qualitative analysis specified in JIS A1481. The measuring conditions are as follows. The presence of a $Ba_{0.808}Al_{1.71}Si_{2.29}O_8$ phase is confirmed by comparing with the reference data of International Centre for Diffraction Data (ICDD).

Measuring Conditions
  X-ray tube anticathode: Cu
  Tube voltage: 40 kV
  Tube current: 40 mA
  Scanning speed: 0.02°×10 sec
  Monochromatization (removal of Cu-K beta radiation): Ni filter
  Scanning range (2θ):5°-80°
  Divergence slit: 1°

Method Of Measuring Reflectance:

The reflectance is measured using a spectrophotometer U-4000 from Hitachi, Ltd. The wavelength dependency of the sum of specular reflection and diffuse reflection is determined in accordance with JIS K7105. The reflectance of a sample is relatively expressed taking the reflectance of an aluminum oxide plate as a standard white material as 100%.

The alumina ceramic containing a $Ba_{0.808}Al_{1.71}Si_{2.29}O_8$ phase according to the invention is useful as a substrate for mounting a light emitting element or a reflecting material for a light emitting element, such as a frame for reflecting light emitted from a light emitting element.

EXAMPLES

Preparation of the alumina ceramics containing a $Ba_{0.808}Al_{1.71}Si_{2.29}O_8$ phase according to the invention will now be illustrated with reference to Examples, but it should be understood that the invention is not deemed to be limited thereto.

Example 1

Eighty-nine parts by weight of high purity alumina AES-12 (from Sumitomo Chemical Co., Ltd.; average particle size: 0.4 μm; purity: 99.5%), 8 parts by weight of high purity barium carbonate LSR (from Nippon Chemical Industrial Co., Ltd.; average particle size: 1.4 μm), 3 parts by weight of fine silica particles SO-C2 (from Shin-Etsu Quartz Products Co., Ltd.; average particle size: 0.5 μm), 3 parts by weight of a binder NCB-156 (from DIC Corp.), and 0.1 parts by weight of a lubricant Cellosol 920 (from Chukyo Yushi Co., Ltd.) were blended and dispersed with water in a ball mill to prepare a slurry. The slurry was granulated by drying at 110° C., and the resulting powder was screened to remove fines and large particles using sieves having an opening size of 25 μm and 150 μm.

The powder was packed in a mold for a frame and pressed at room temperature under a pressure of 1 t/cm² using a 10 t press (from "SANKENSEIKI") to obtain a green body having the shape of a frame. The green body was fired at 1550° C. for 2 hours to make an alumina ceramic frame.

Example 2

Low soda alumina ALM-42E (from Sumitomo Chemical; average particle size: 2.0 μm; purity: 99.9%) (68.8 parts by weight), 17.2 parts by weight of high purity alumina AES-12 (from Sumitomo Chemical; average particle size: 0.4 μm; purity: 99.5%), 8 parts by weight of high purity barium carbonate LSR (from Nippon Chemical Industrial; average particle size: 1.4 μm), 6 parts by weight of fine silica particles SO-C2 (from Shin-Etsu Quartz; average particle size: 0.5 μm), 4 parts by weight of a butyral resin BLS (from Sekisui Chemical Co., Ltd.) as a binder, 4 parts by weight of BL-SZ (from Sekisui Chemical) as a binder, 4 parts by weight of DOP as a plasticizer, and 0.5 parts by weight of sorbitan sesquioleate as a lubricant were blended and dispersed in 30 parts by weight of a 50:50 (by weight) mixed solvent of toluene and ethanol in a ball mill for 48 hours to make a slurry. The slurry was applied to a release PET film and dried at 110° C. The film was stripped off to obtain a green sheet, which was stamped into a prescribed shape and fired at 1600° C. for 2 hours to obtain an alumina ceramic substrate.

Example 3

An alumina ceramic substrate was obtained in the same manner as in Example 2, except for changing the amounts of the low soda alumina ALM-42E (average particle size: 2.0 μm; purity: 99.9%) and the high purity alumina AES-12 (average particle size: 0.4 μm; purity: 99.5%) to 60.2 parts by weight and 25.8 parts by weight, respectively.

Example 4

An alumina ceramic substrate was obtained in the same manner as in Example 2, except for using, as alumina, 86 parts by weight of the low soda alumina ALM-42E (average particle size: 2.0 μm; purity: 99.9%).

X-ray Diffractometry:

The alumina ceramic frame and substrate obtained in Examples 1 and 2 were analyzed by X-ray diffractometry in accordance with the method described. The results obtained are shown in FIGS. 1 and 2. As is apparent from FIGS. 1 and 2, the alumina ceramic frame and substrate of the present invention have a peak at a diffraction angle (2θ) of 22.5°, proving the existence of a $Ba_{0.808}Al_{1.71}Si_{2.29}O_8$ phase. It was also found that the ratio of the peak intensity at 2θ=44.3°, which is assigned to a corundum ($Al_2O_3$) phase, to that at 22.5° was 2.0 in Example 1 and 1.1 in Example 2. The X-ray diffraction pattern of a $Ba_{0.808}Al_{1.71}Si_{2.29}O_8$ phase described in ICDD card No. 01-088-1050 is shown in FIG. 4, and that of a corundum ($Al_2O_3$) phase described in ICDD card No. 01-070-7049 is shown in FIG. 5.

Measurement of Reflectance:

The reflectance of the alumina ceramic frame and substrates obtained in Examples 1 to 4 was measured in accordance with the method described supra. In Comparative Example 1, the reflectance of an alumina substrate available from Hokuriku Ceramic K.K. (alumina purity: 96%) was measured. The results obtained are shown in FIG. 3.

The invention claimed is:

1. An alumina ceramic containing a $Ba_{0.808}Al_{1.71}Si_{2.29}O_8$ phase.

2. The alumina ceramic according to claim 1, having an X-ray diffraction pattern having a ratio of the peak intensity at diffraction angle (2θ) of 43.3° to that at 2θ of 22.5° of 0.5 to 2.5.

3. The alumina ceramic according to claim 1, having a Ba to Si molar ratio, Ba/Si, of 8/1 to 8/12.

4. A reflective material for a light emitting element, comprising the alumina ceramic according to claim 1.

5. The alumina ceramic according to claim 2, having a Ba to Si molar ratio, Ba/Si, of 8/1 to 8/12.

6. A reflective material for a light emitting element, comprising the alumina ceramic according to claim 2.

7. A reflective material for a light emitting element, comprising the alumina ceramic according to claim 3.

8. A reflective material for a light emitting element, comprising the alumina ceramic according to claim 5.

* * * * *